(12) United States Patent
Tsuji

(10) Patent No.: US 6,756,263 B2
(45) Date of Patent: Jun. 29, 2004

(54) METHOD OF MANUFACTURING SEMICONDUCTOR DEVICE

(75) Inventor: Naoki Tsuji, Hyogo (JP)

(73) Assignee: Rensas Technology Corp., Tokyo (JP)

(*) Notice: Subject to any disclaimer, the term of this patent is extended or adjusted under 35 U.S.C. 154(b) by 0 days.

(21) Appl. No.: 10/173,261

(22) Filed: Jun. 18, 2002

(65) Prior Publication Data

US 2003/0124793 A1 Jul. 3, 2003

(30) Foreign Application Priority Data

Dec. 28, 2001 (JP) .................................. 2001-400429

(51) Int. Cl.⁷ .................... H01L 21/31; H01L 21/469
(52) U.S. Cl. ................. 438/241; 438/258; 438/275; 438/296; 438/763; 438/981
(58) Field of Search ................. 438/257–267, 438/240, 981, 296, 241, 763, 275

(56) References Cited

U.S. PATENT DOCUMENTS

| | | | |
|---|---|---|---|
| 5,506,178 A | * 4/1996 | Suzuki et al. | 438/773 |
| 6,110,780 A | * 8/2000 | Yu et al. | 438/258 |
| 6,162,683 A | * 12/2000 | Chen | 438/258 |
| 2003/0006448 A1 | * 1/2003 | Mehrad et al. | 257/314 |
| 2003/0054608 A1 | * 3/2003 | Tseng et al. | 438/257 |

OTHER PUBLICATIONS

Related U.S. application No. 09/745,468, filed Dec. 26, 2000 (Our Ref. No. 49657–862).

* cited by examiner

Primary Examiner—Richard A. Booth
(74) Attorney, Agent, or Firm—McDermott, Will & Emery

(57) ABSTRACT

A semiconductor device includes a trench isolating elements, a memory cell transistor and a peripheral circuit Vcc transistor having a thermal oxide film of a first thickness, and a peripheral circuit Vpp transistor including a thermal oxide film and a thermal oxide film formed before trench formation, having a second thickness greater than the first thickness.

5 Claims, 32 Drawing Sheets

<MEMORY CELL TRANSISTOR REGION>

<PERIPHERAL CIRCUIT Vcc TRANSISTOR REGION>

<PERIPHERAL CIRCUIT Vpp TRANSISTOR REGION>

FIG. 1A  <MEMORY CELL TRANSISTOR REGION>
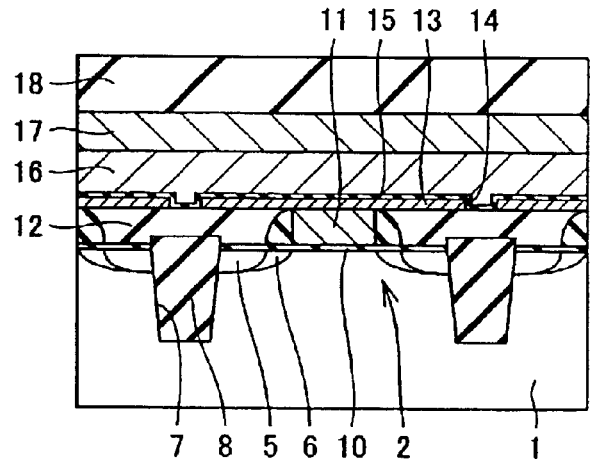
FIG. 1B  <PERIPHERAL CIRCUIT Vcc TRANSISTOR REGION>
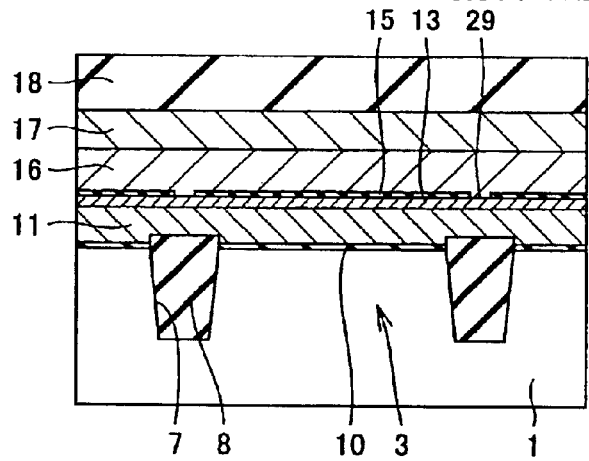
FIG. 1C  <PERIPHERAL CIRCUIT Vpp TRANSISTOR REGION>
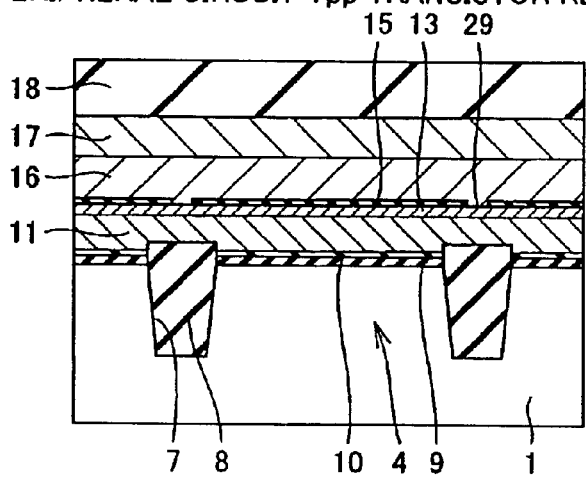

FIG.2A  <MEMORY CELL TRANSISTOR REGION>
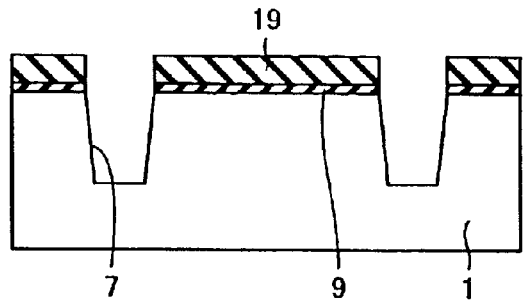
FIG.2B  <PERIPHERAL CIRCUIT Vcc TRANSISTOR REGION>
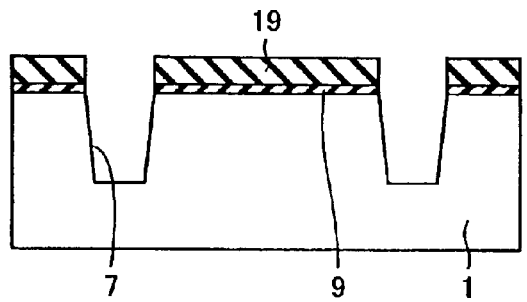
FIG.2C  <PERIPHERAL CIRCUIT Vpp TRANSISTOR REGION>
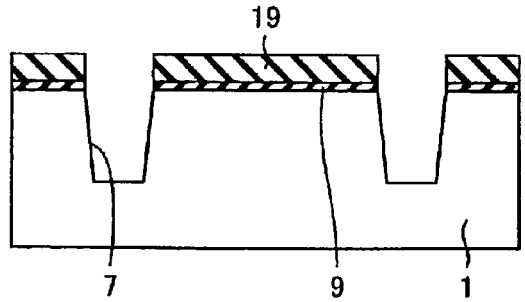

FIG.3A  <MEMORY CELL TRANSISTOR REGION>
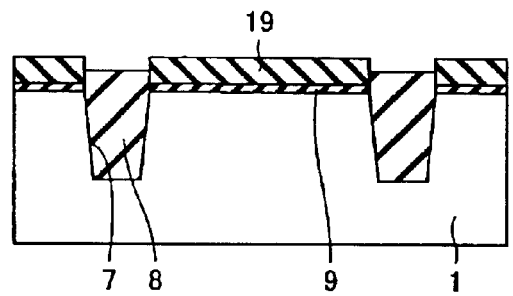
FIG.3B  <PERIPHERAL CIRCUIT Vcc TRANSISTOR REGION>
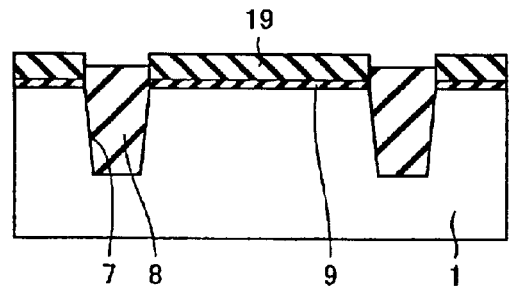
FIG.3C  <PERIPHERAL CIRCUIT Vpp TRANSISTOR REGION>
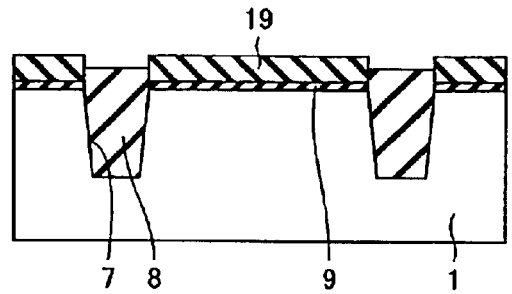

FIG.4A  <MEMORY CELL TRANSISTOR REGION>
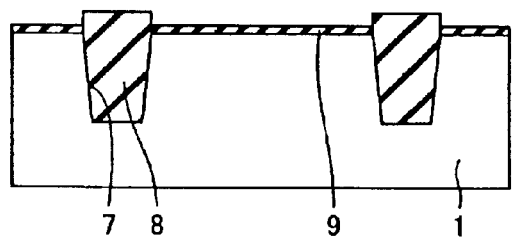
FIG.4B  <PERIPHERAL CIRCUIT Vcc TRANSISTOR REGION>
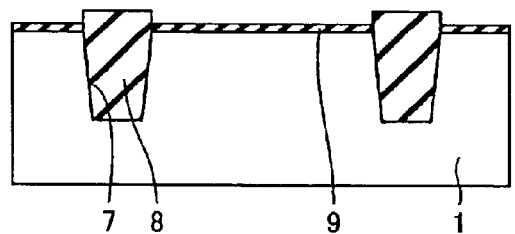
FIG.4C  <PERIPHERAL CIRCUIT Vpp TRANSISTOR REGION>
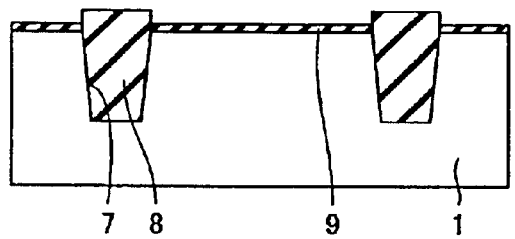

FIG.5A   <MEMORY CELL TRANSISTOR REGION>
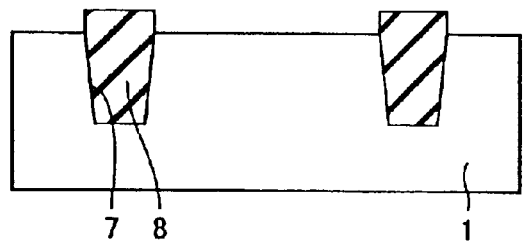
FIG.5B   <PERIPHERAL CIRCUIT Vcc TRANSISTOR REGION>
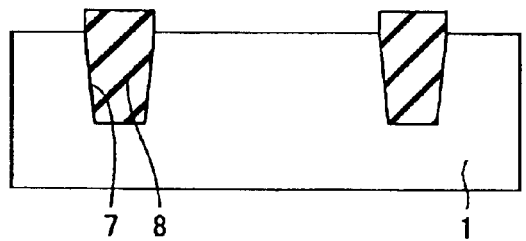
FIG.5C   <PERIPHERAL CIRCUIT Vpp TRANSISTOR REGION>
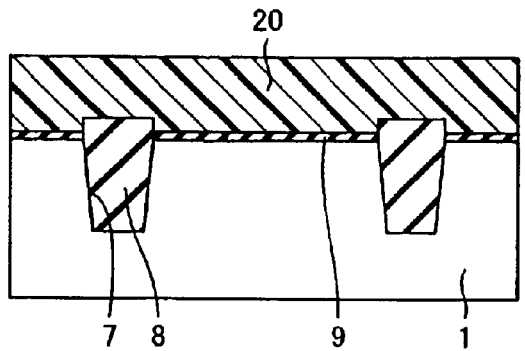

FIG.6A     <MEMORY CELL TRANSISTOR REGION>
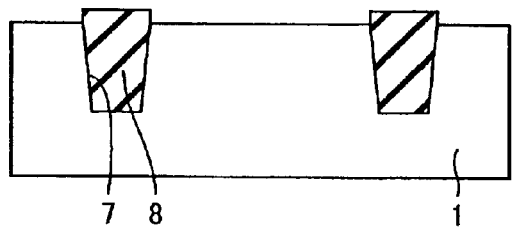
FIG.6B     <PERIPHERAL CIRCUIT Vcc TRANSISTOR REGION>
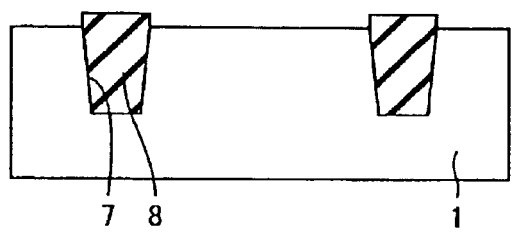
FIG.6C     <PERIPHERAL CIRCUIT Vpp TRANSISTOR REGION>
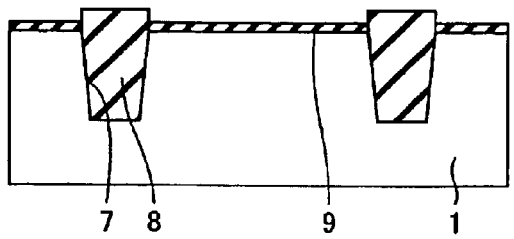

FIG.7A     <MEMORY CELL TRANSISTOR REGION>
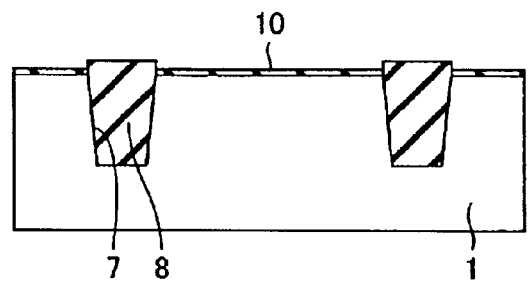
FIG.7B     <PERIPHERAL CIRCUIT Vcc TRANSISTOR REGION>
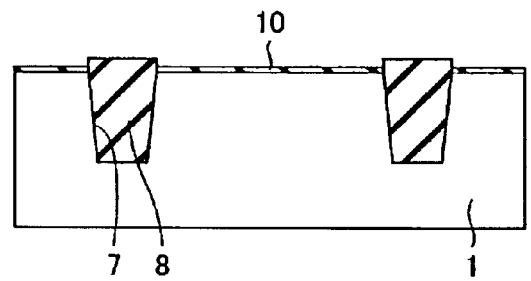
FIG.7C     <PERIPHERAL CIRCUIT Vpp TRANSISTOR REGION>
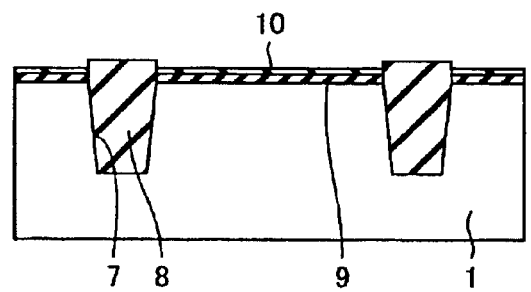

FIG.8A <MEMORY CELL TRANSISTOR REGION>
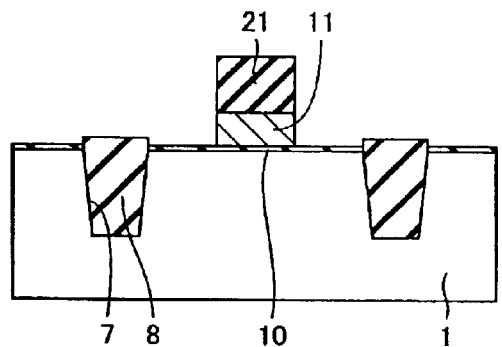
FIG.8B <PERIPHERAL CIRCUIT Vcc TRANSISTOR REGION>
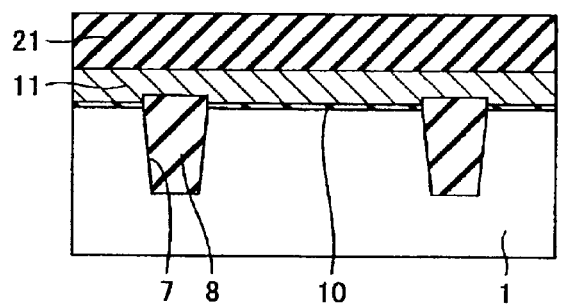
FIG.8C <PERIPHERAL CIRCUIT Vpp TRANSISTOR REGION>
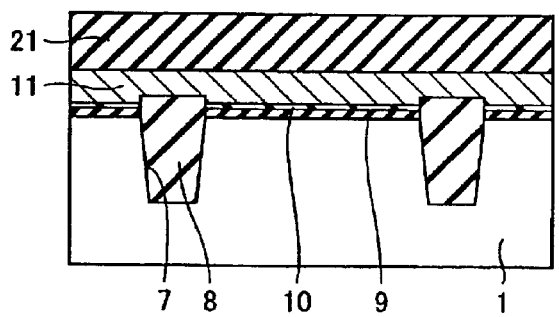

FIG.9A  <MEMORY CELL TRANSISTOR REGION>
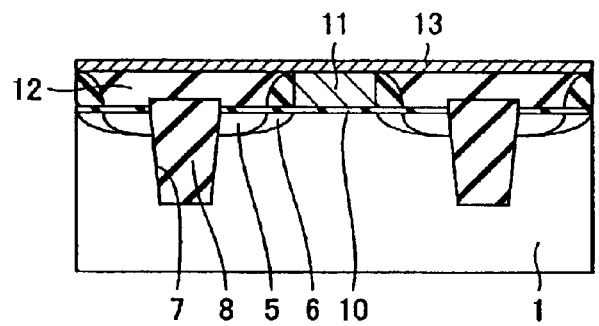
FIG.9B  <PERIPHERAL CIRCUIT Vcc TRANSISTOR REGION>
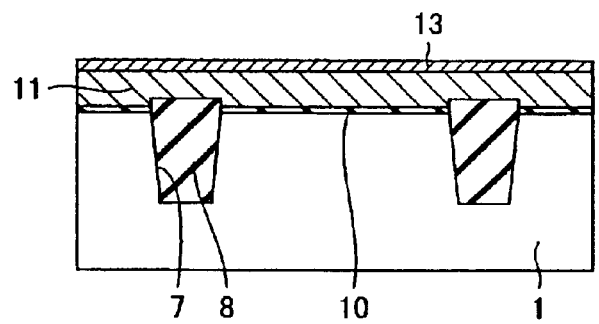
FIG.9C  <PERIPHERAL CIRCUIT Vpp TRANSISTOR REGION>
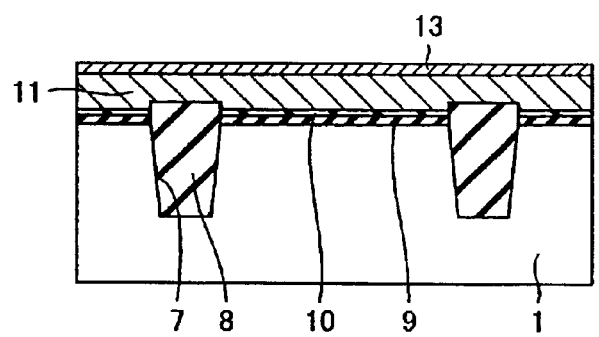

FIG.10A <MEMORY CELL TRANSISTOR REGION>
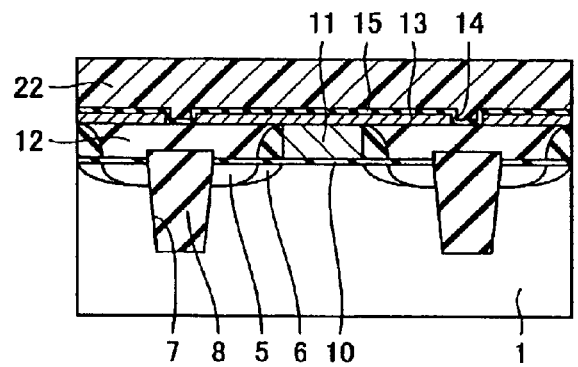
FIG.10B <PERIPHERAL CIRCUIT Vcc TRANSISTOR REGION>
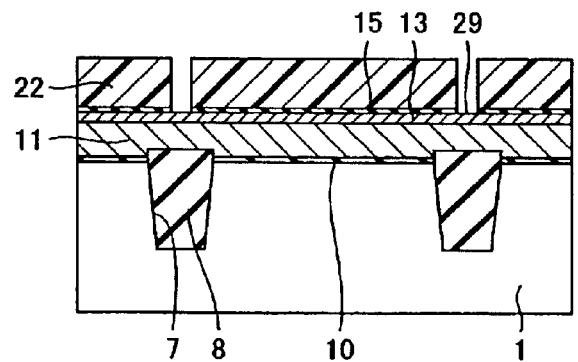
FIG.10C <PERIPHERAL CIRCUIT Vpp TRANSISTOR REGION>
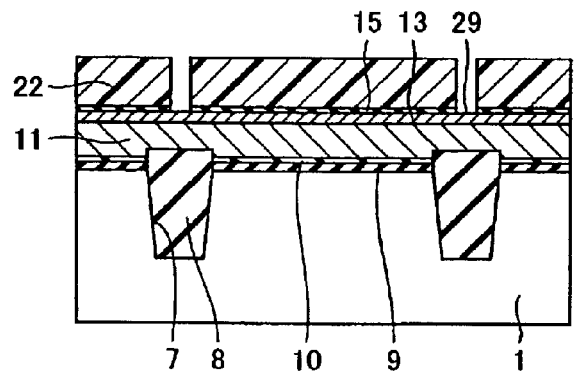

FIG.11A <MEMORY CELL TRANSISTOR REGION>
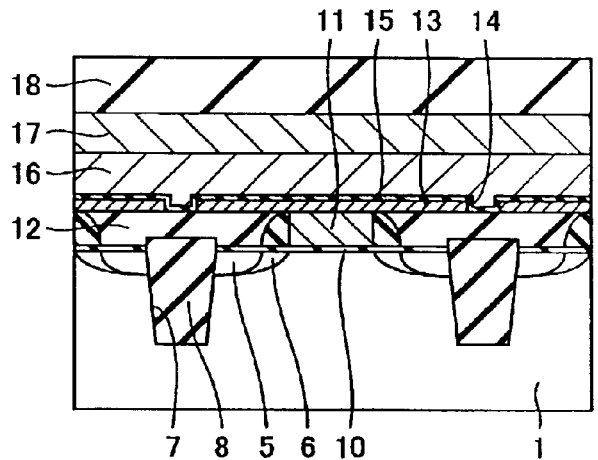
FIG.11B <PERIPHERAL CIRCUIT Vcc TRANSISTOR REGION>
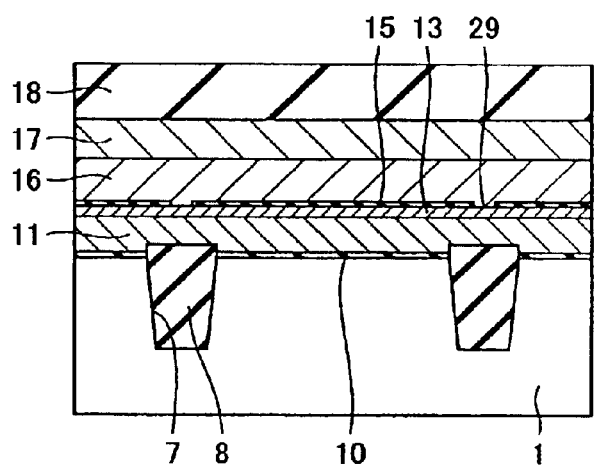
FIG.11C <PERIPHERAL CIRCUIT Vpp TRANSISTOR REGION>
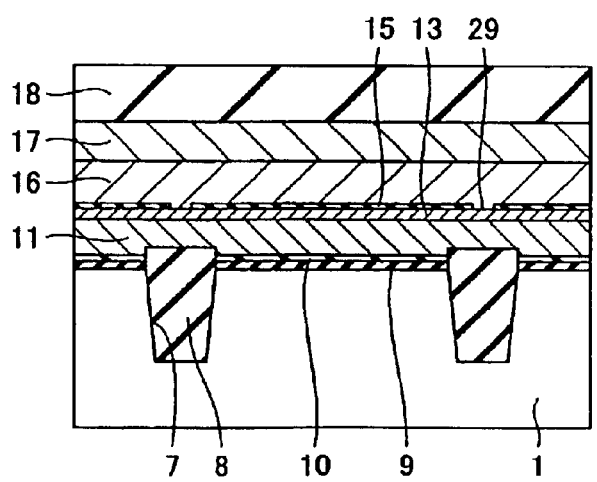

FIG.12A  <MEMORY CELL TRANSISTOR REGION>
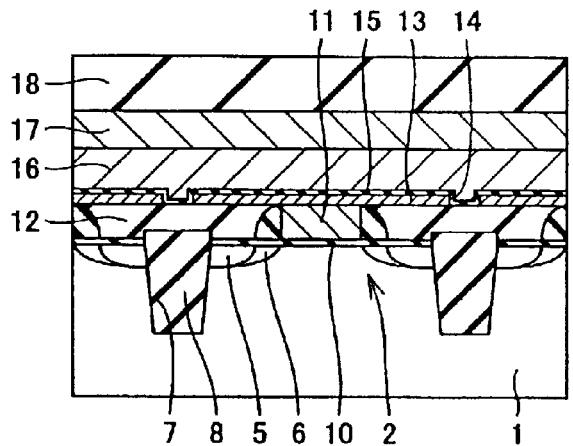
FIG.12B  <PERIPHERAL CIRCUIT Vcc TRANSISTOR REGION>
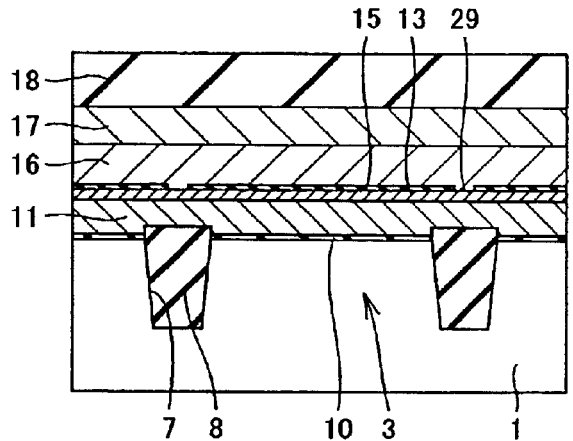
FIG.12C  <PERIPHERAL CIRCUIT Vpp TRANSISTOR REGION>
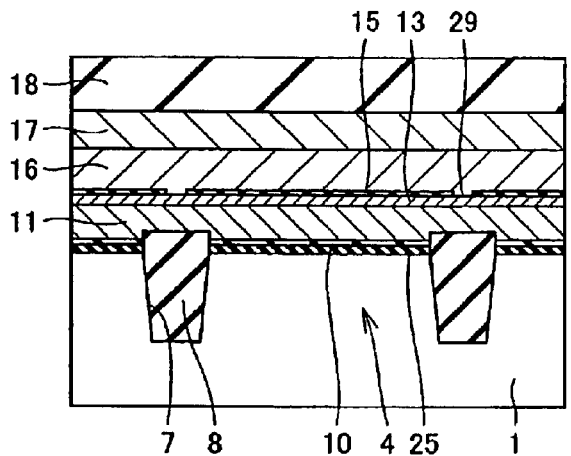

FIG.13A  <MEMORY CELL TRANSISTOR REGION>
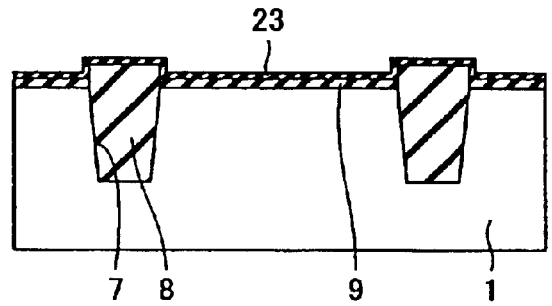
FIG.13B  <PERIPHERAL CIRCUIT Vcc TRANSISTOR REGION>
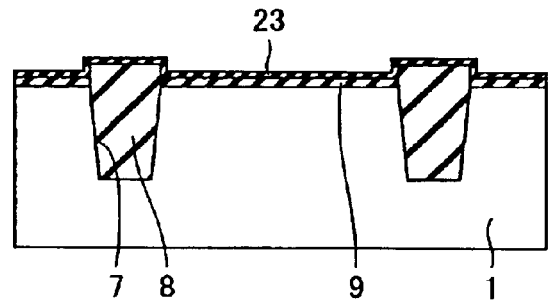
FIG.13C  <PERIPHERAL CIRCUIT Vpp TRANSISTOR REGION>
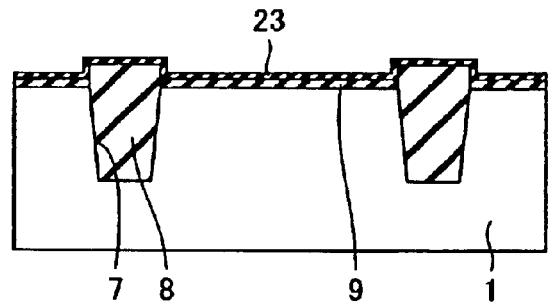

FIG.14A <MEMORY CELL TRANSISTOR REGION>
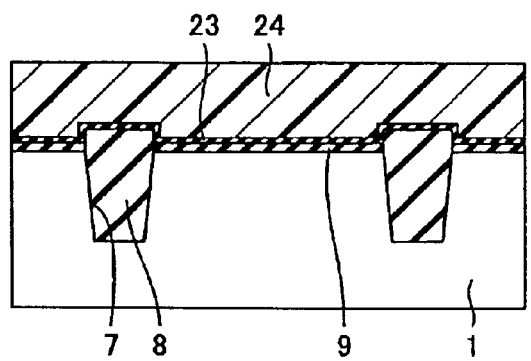
FIG.14B <PERIPHERAL CIRCUIT Vcc TRANSISTOR REGION>
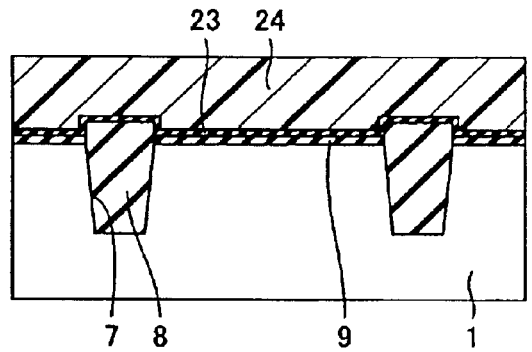
FIG.14C <PERIPHERAL CIRCUIT Vpp TRANSISTOR REGION>
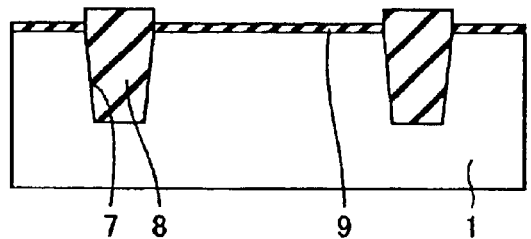

FIG.15A    <MEMORY CELL TRANSISTOR REGION>
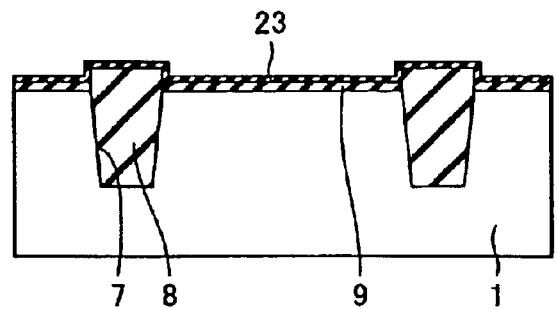
FIG.15B    <PERIPHERAL CIRCUIT Vcc TRANSISTOR REGION>
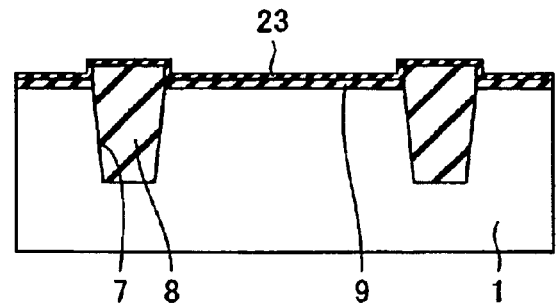
FIG.15C    <PERIPHERAL CIRCUIT Vpp TRANSISTOR REGION>
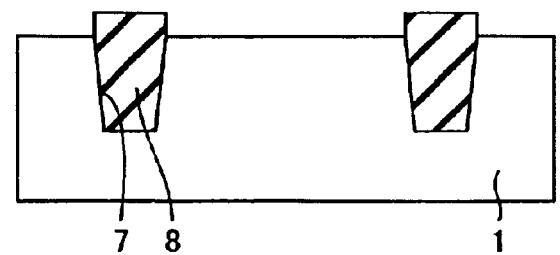

FIG.16A  <MEMORY CELL TRANSISTOR REGION>
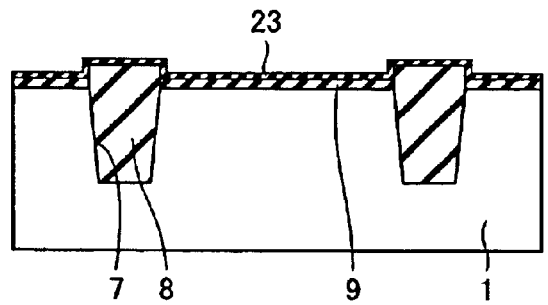
FIG.16B  <PERIPHERAL CIRCUIT Vcc TRANSISTOR REGION>
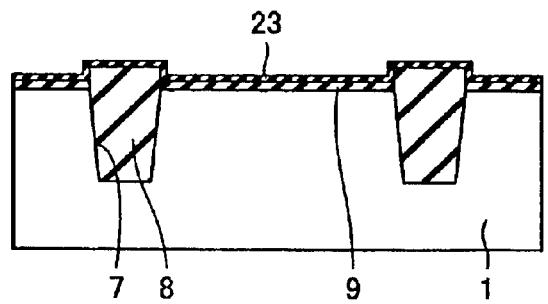
FIG.16C  <PERIPHERAL CIRCUIT Vpp TRANSISTOR REGION>
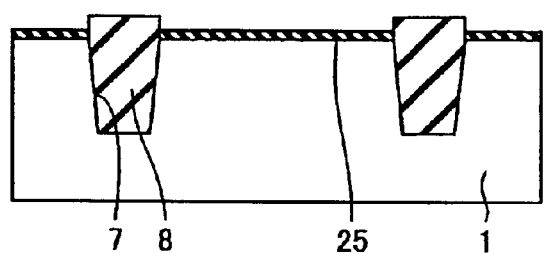

FIG.17A  <MEMORY CELL TRANSISTOR REGION>
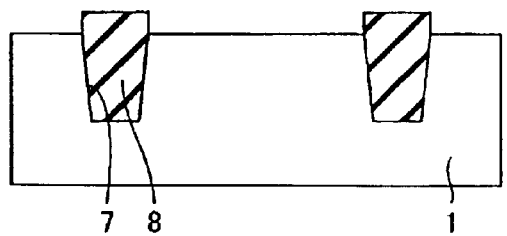
FIG.17B  <PERIPHERAL CIRCUIT Vcc TRANSISTOR REGION>
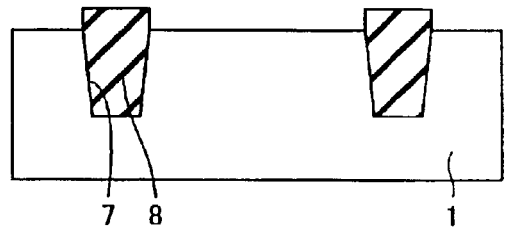
FIG.17C  <PERIPHERAL CIRCUIT Vpp TRANSISTOR REGION>
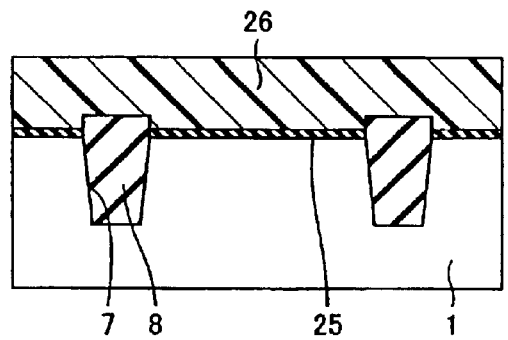

FIG.18A <MEMORY CELL TRANSISTOR REGION>
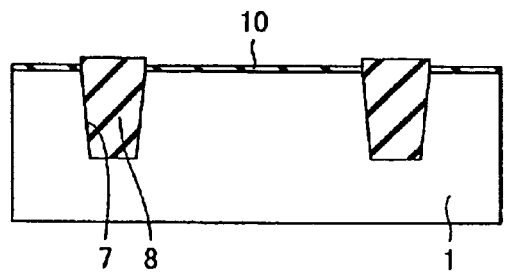
FIG.18B <PERIPHERAL CIRCUIT Vcc TRANSISTOR REGION>
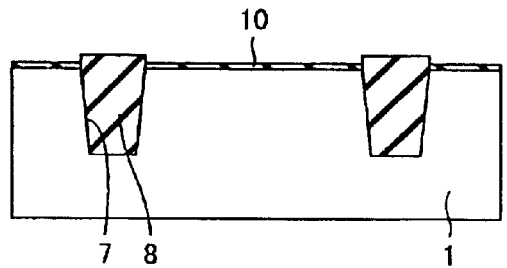
FIG.18C <PERIPHERAL CIRCUIT Vpp TRANSISTOR REGION>
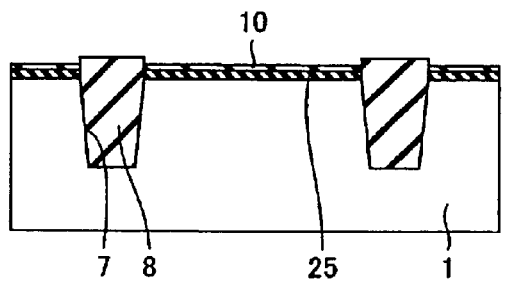

FIG.19A <MEMORY CELL TRANSISTOR REGION>
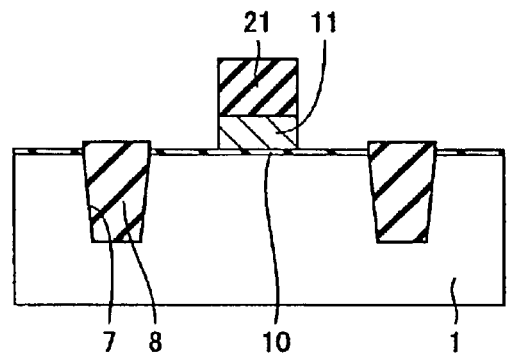
FIG.19B <PERIPHERAL CIRCUIT Vcc TRANSISTOR REGION>
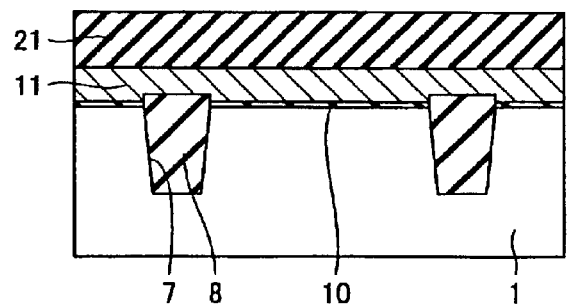
FIG.19C <PERIPHERAL CIRCUIT Vpp TRANSISTOR REGION>
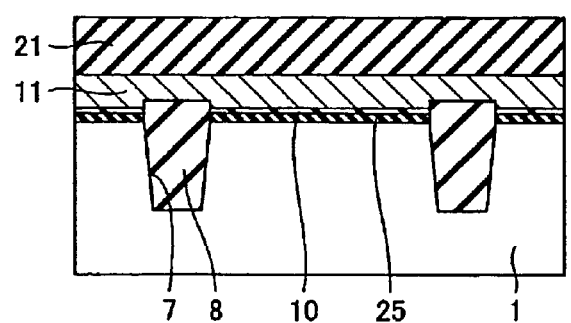

FIG.20A     <MEMORY CELL TRANSISTOR REGION>
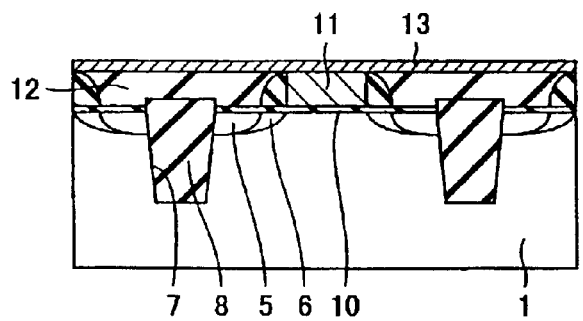
FIG.20B     <PERIPHERAL CIRCUIT Vcc TRANSISTOR REGION>
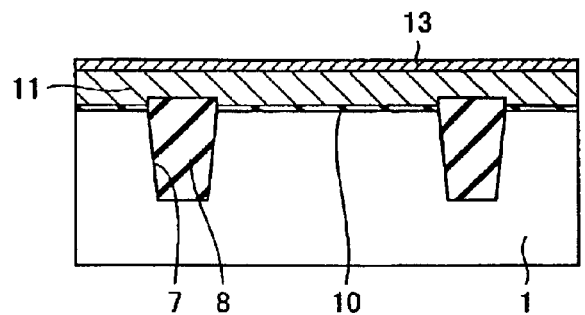
FIG.20C     <PERIPHERAL CIRCUIT Vpp TRANSISTOR REGION>
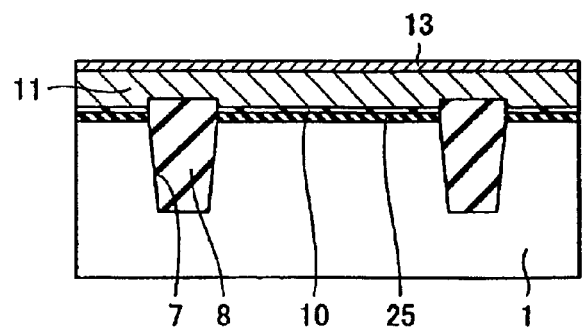

FIG.21A  <MEMORY CELL TRANSISTOR REGION>
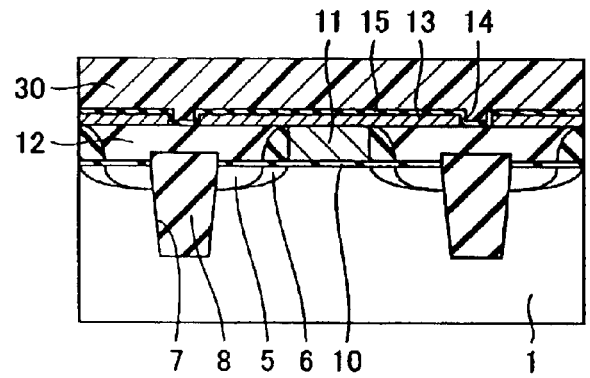
FIG.21B  <PERIPHERAL CIRCUIT Vcc TRANSISTOR REGION>
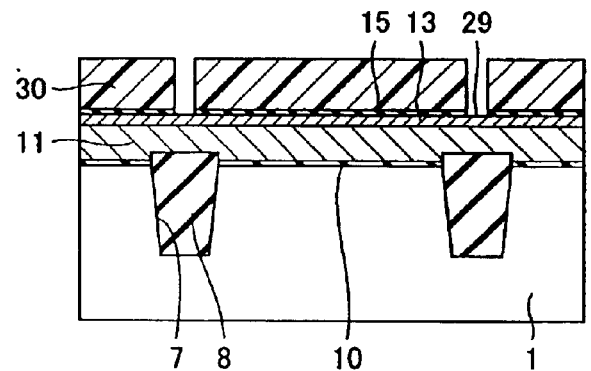
FIG.21C  <PERIPHERAL CIRCUIT Vpp TRANSISTOR REGION>
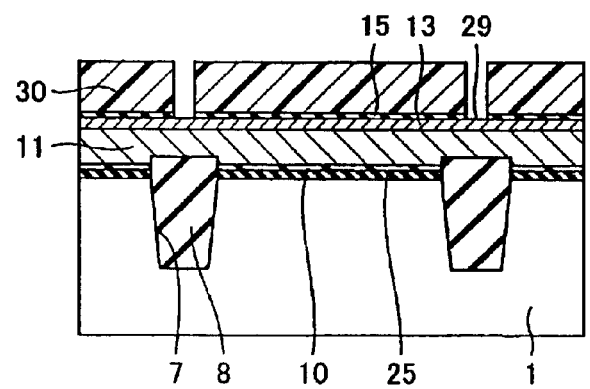

FIG.22A  <MEMORY CELL TRANSISTOR REGION>
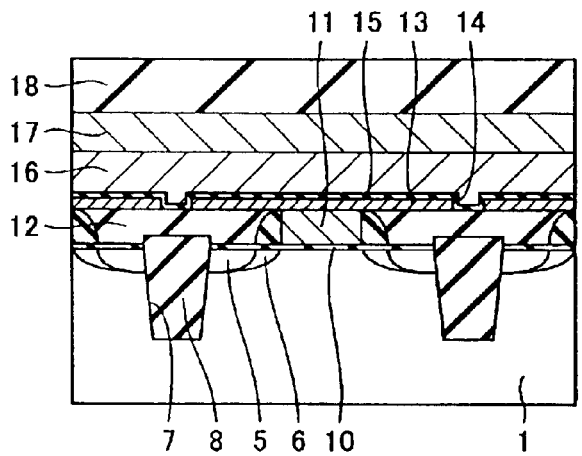
FIG.22B  <PERIPHERAL CIRCUIT Vcc TRANSISTOR REGION>
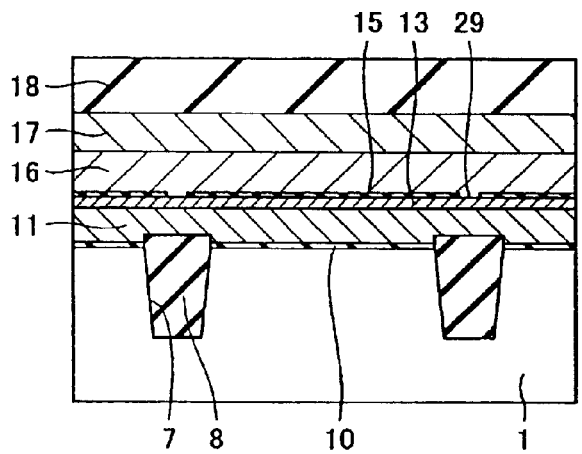
FIG.22C  <PERIPHERAL CIRCUIT Vpp TRANSISTOR REGION>
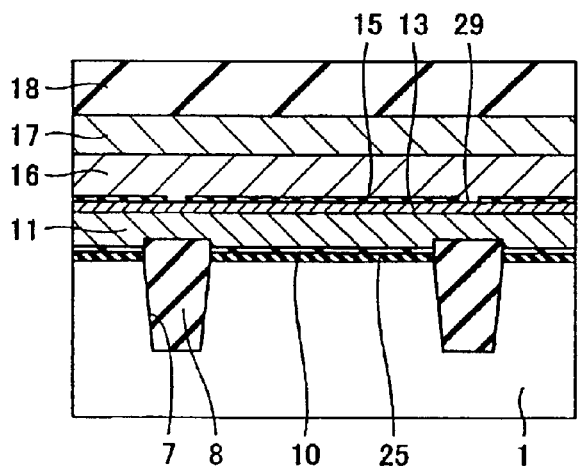

FIG.23A <MEMORY CELL TRANSISTOR REGION>
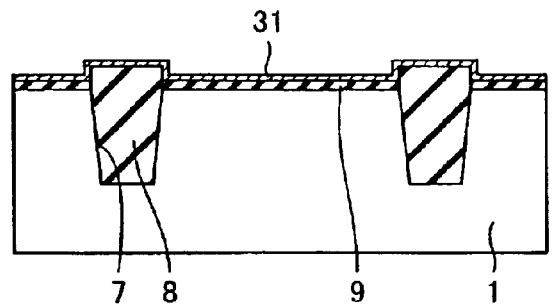
FIG.23B <PERIPHERAL CIRCUIT Vcc TRANSISTOR REGION>
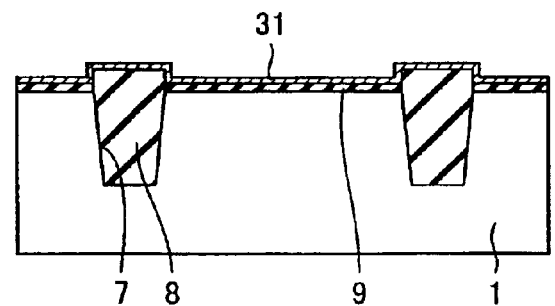
FIG.23C <PERIPHERAL CIRCUIT Vpp TRANSISTOR REGION>
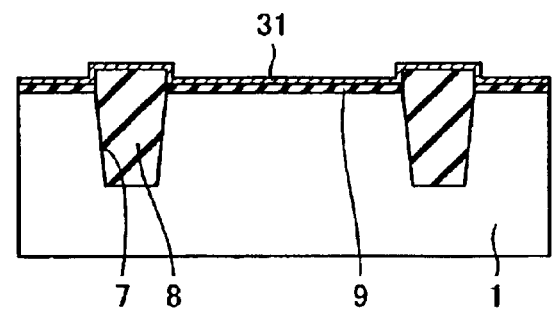

FIG.24A <MEMORY CELL TRANSISTOR REGION>
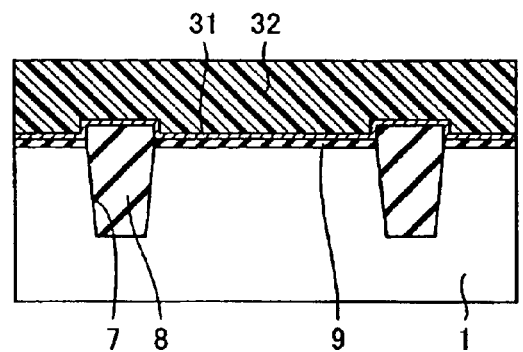
FIG.24B <PERIPHERAL CIRCUIT Vcc TRANSISTOR REGION>
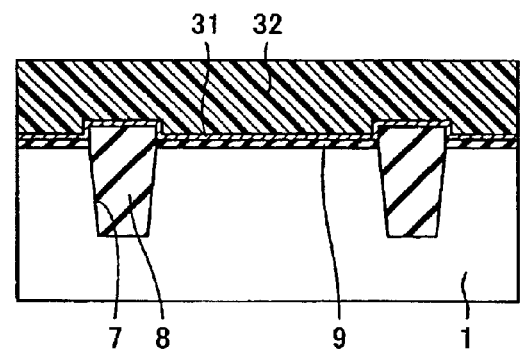
FIG.24C <PERIPHERAL CIRCUIT Vpp TRANSISTOR REGION>
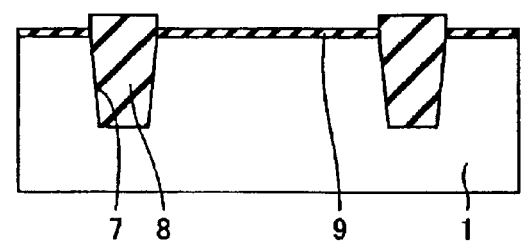

FIG.25A  <MEMORY CELL TRANSISTOR REGION>
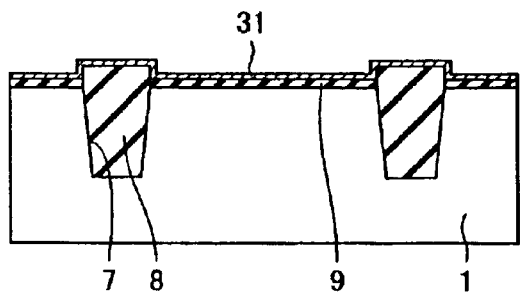
FIG.25B  <PERIPHERAL CIRCUIT Vcc TRANSISTOR REGION>
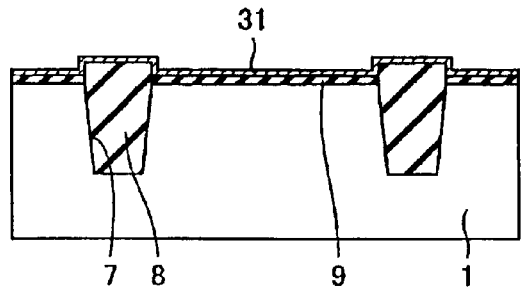
FIG.25C  <PERIPHERAL CIRCUIT Vpp TRANSISTOR REGION>
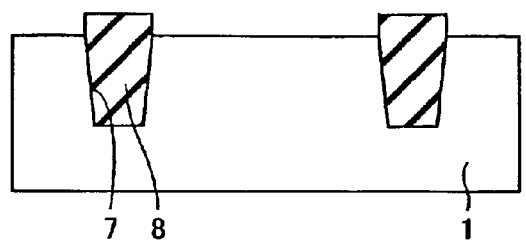

FIG.26A  <MEMORY CELL TRANSISTOR REGION>
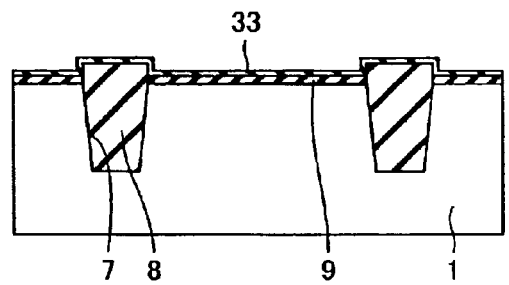
FIG.26B  <PERIPHERAL CIRCUIT Vcc TRANSISTOR REGION>
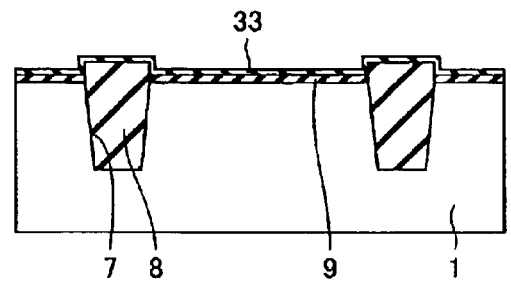
FIG.26C  <PERIPHERAL CIRCUIT Vpp TRANSISTOR REGION>
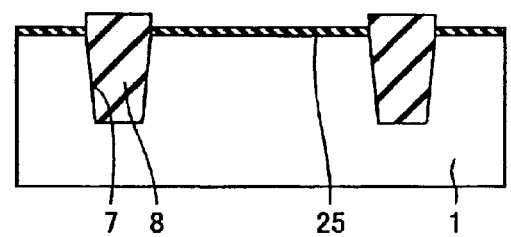

FIG.27A <MEMORY CELL TRANSISTOR REGION>
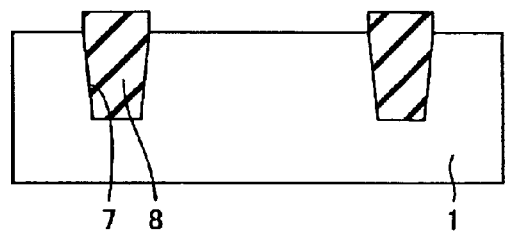
FIG.27B <PERIPHERAL CIRCUIT Vcc TRANSISTOR REGION>
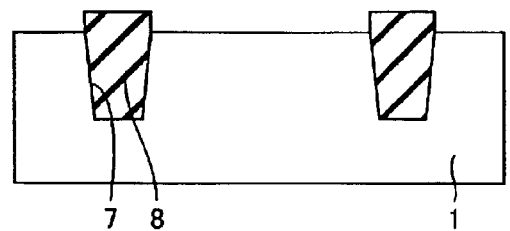
FIG.27C <PERIPHERAL CIRCUIT Vpp TRANSISTOR REGION>
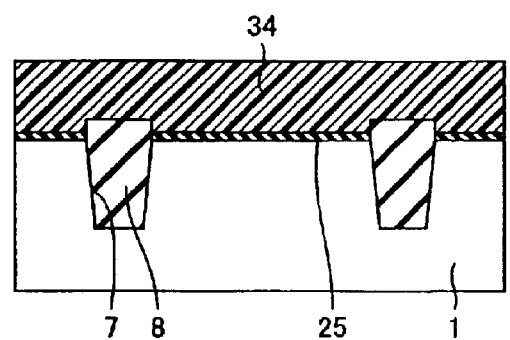

FIG.28A <MEMORY CELL TRANSISTOR REGION>
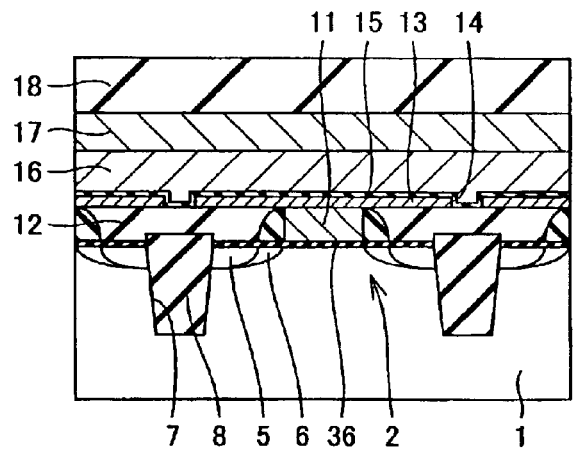
FIG.28B <PERIPHERAL CIRCUIT Vcc TRANSISTOR REGION>
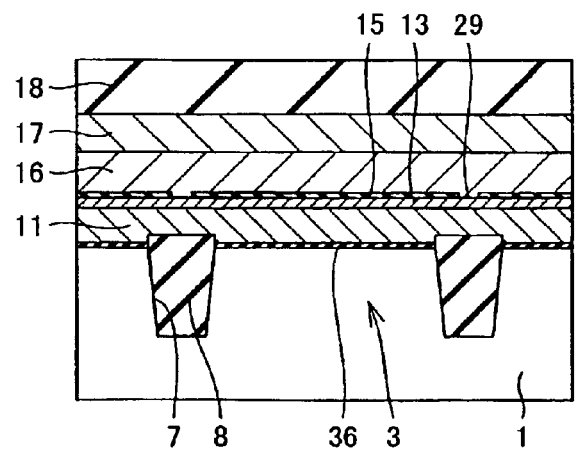
FIG.28C <PERIPHERAL CIRCUIT Vpp TRANSISTOR REGION>
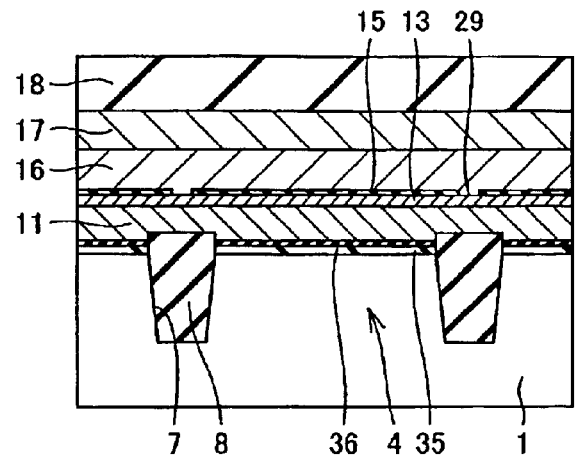

FIG.29A <MEMORY CELL TRANSISTOR REGION>
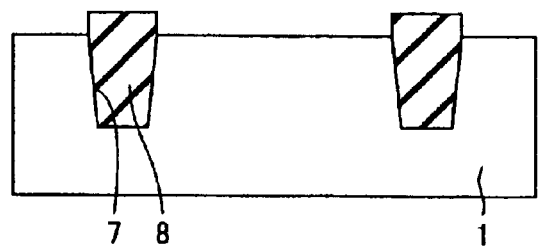
FIG.29B <PERIPHERAL CIRCUIT Vcc TRANSISTOR REGION>
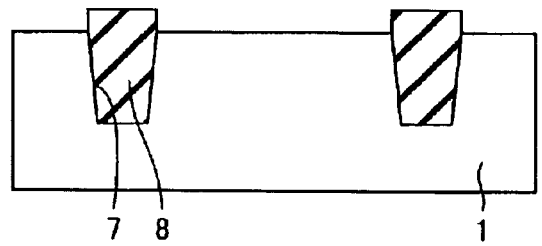
FIG.29C <PERIPHERAL CIRCUIT Vpp TRANSISTOR REGION>
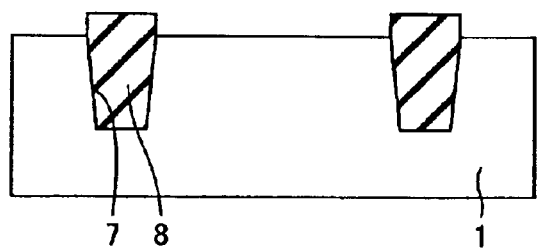

FIG.30A     <MEMORY CELL TRANSISTOR REGION>
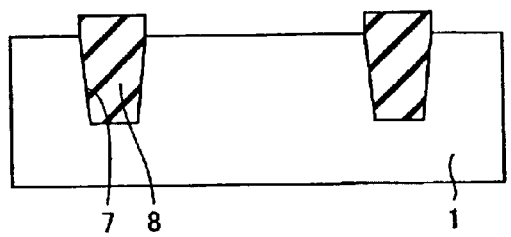
FIG.30B     <PERIPHERAL CIRCUIT Vcc TRANSISTOR REGION>
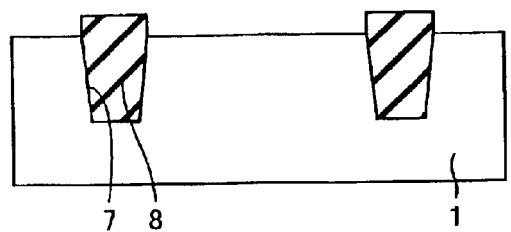
FIG.30C     <PERIPHERAL CIRCUIT Vpp TRANSISTOR REGION>
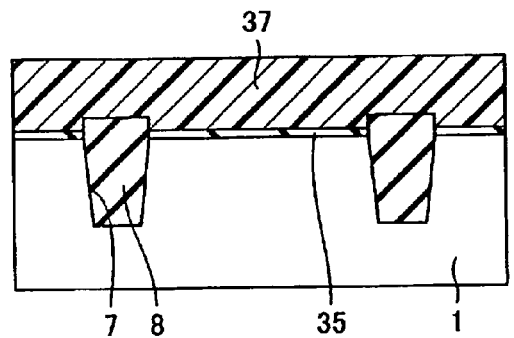

FIG.31A <MEMORY CELL TRANSISTOR REGION>
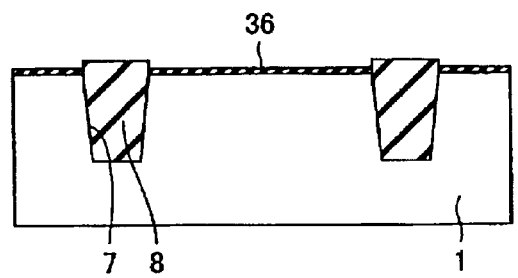
FIG.31B <PERIPHERAL CIRCUIT Vcc TRANSISTOR REGION>
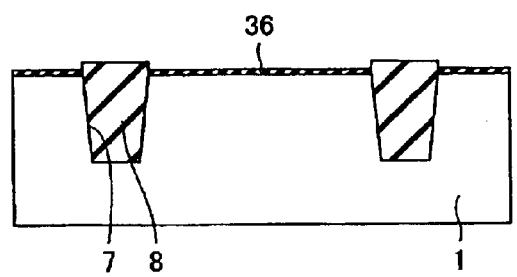
FIG.31C <PERIPHERAL CIRCUIT Vpp TRANSISTOR REGION>
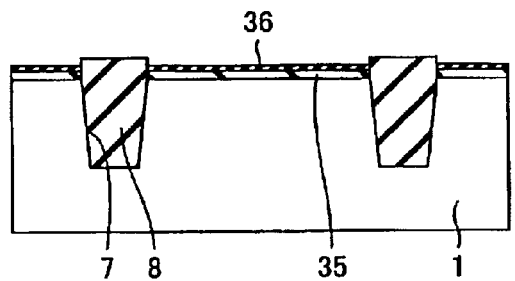

FIG.32A   <MEMORY CELL TRANSISTOR REGION>
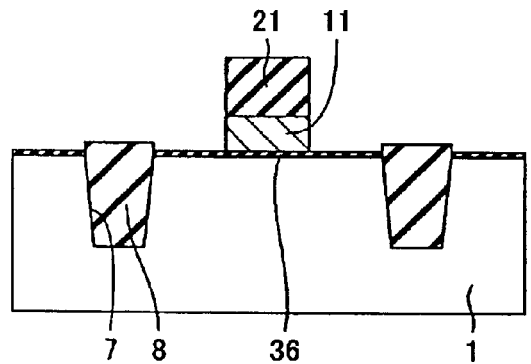
FIG.32B   <PERIPHERAL CIRCUIT Vcc TRANSISTOR REGION>
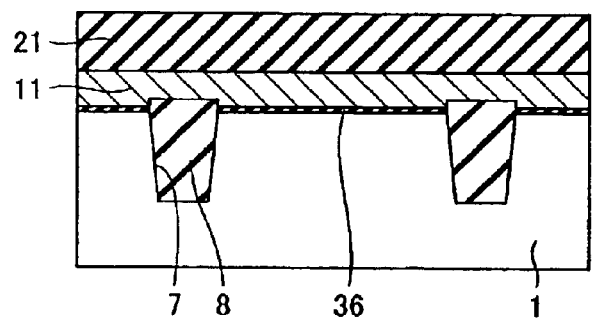
FIG.32C   <PERIPHERAL CIRCUIT Vpp TRANSISTOR REGION>
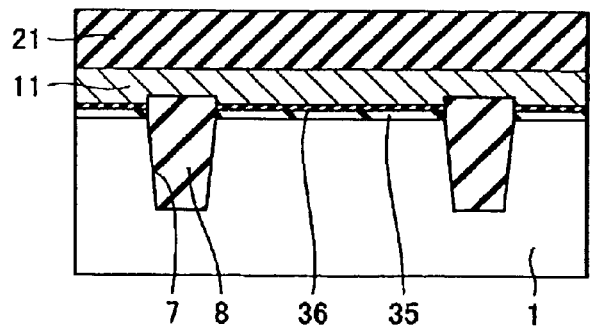

METHOD OF MANUFACTURING SEMICONDUCTOR DEVICE

BACKGROUND OF THE INVENTION

1. Field of the Invention

The present invention relates to a semiconductor device and a method of manufacturing the same, and more particularly to a semiconductor device including trench isolation for electrically isolating elements and a transistor having a gate oxide film of at least two different thicknesses, and a method of manufacturing the same.

2. Description of the Background Art

When trench isolation is used for element isolation in place of conventional LOCOS (Local Oxidation of Silicon), a trench is formed in a semiconductor substrate and an oxide film is buried in this trench for example by CVD (Chemical Vapor Deposition) or the like. An element such as an MOS (Metal Oxide Semiconductor) transistor or the like is then formed on the main surface of the silicon substrate.

An oxidation process is essential after formation of trench isolation in a manufacturing process of semiconductor device. When an MOS transistor is formed on a main surface of a silicon substrate, for example, the main surface of the semiconductor substrate is thermally oxidized after formation of the trench isolation, to form a gate oxide film.

Here, an oxidizing agent diffuses into a silicon oxide film buried in the trench and reacts with silicon at a trench inner wall, causing the trench inner wall to be oxidized. The silicon at the trench inner wall thereby becomes a silicon oxide film. When silicon changes to a silicon oxide film in this way, the volume of the silicon oxide film is almost double the oxidized silicon.

The result is the situation equivalent to expansion of the silicon oxide film buried in the trench, so that the active region surrounding the trench suffers from compressive stress and a crystal defect is caused in the silicon substrate. Such a crystal defect increases a junction leakage current, resulting in an increased power consumption in a semiconductor device.

The aforementioned problem tends to arise when a trench isolation pitch is short and a number of oxidation processes are performed on a trench isolation region, that is, in case of a semiconductor device including a transistor having a gate oxide film of two or more different thicknesses. More particularly, the aforementioned problem is prominent in a nonvolatile semiconductor memory device requiring a high voltage transistor in a peripheral circuit, having a thick gate oxide film, and thus inevitably being subjected to a large number of oxidation processes.

Furthermore, this problem arises more prominently in a miniaturized non-volatile semiconductor memory device. More specifically, even though a non-volatile semiconductor memory device scales down, a tunnel oxide film of a cell transistor cannot be made thinner in accordance with a scaling law, in order to provide sufficient insulation for electrons accumulated in a floating gate.

Moreover, because a tunnel oxide film cannot be made thin in accordance with the scaling law, the coupling of cells inevitably becomes worse and an applied voltage required for writing and erasing tends to be higher with scaling-down. Therefore, a gate oxide film of a high voltage transistor (Vpp) of a peripheral circuit tends to be made thicker rather than thinner. This is quite different from a semiconductor device such as ASIC (Application Specific Integrated Circuit), DRAM (Dynamic Random Access Memory) or the like in which a gate oxide film is thinner with scaling-down.

On the other hand, the trench isolation pitch naturally becomes narrower due to miniaturization, and the device is more susceptible to the stress caused by oxidation. In other words, when non-volatile semiconductor memory devices are scaled down, a crystal defect is more easily caused in the silicon substrate, because the amount of oxidation cannot be reduced and in addition the isolation pitch is narrowed. Therefore, such a process is desired that assures the required gate oxide film thickness and can reduce the substantial amount of oxidation in the trench isolation as compared with a conventional technique.

SUMMARY OF THE INVENTION

The present invention is made to solve the aforementioned problems. It is an object of the present invention is to prevent a defect resulting from excessive oxidation of a trench isolation region in a semiconductor device having trench isolation, particularly in a non-volatile semiconductor memory device.

A semiconductor device in accordance with the present invention includes a trench isolating elements, a first transistor having a first gate oxide film having a first thickness, and a second transistor having a second gate oxide film having a second thickness greater than the first thickness and including an oxide film formed before forming the trench.

The oxide film formed before forming the trench for element isolation is thus used in a part of the relatively thick, second gate oxide film, so that the amount of oxidation applied to the trench isolation region can be reduced as compared with the case where the oxide film is formed after forming a trench.

The present invention is useful for a semiconductor device including a memory cell transistor region and a, peripheral circuit region and having a gate oxide film of two or more different thicknesses. In particular, it is useful for a non-volatile semiconductor memory device.

In one aspect of the present invention, a method of manufacturing a semiconductor device includes the following steps. A first oxide film is formed on a main surface of a semiconductor substrate. A trench is formed in an element-isolating region of the semiconductor substrate using the first oxide film as a mask. The first oxide film on a first region is removed while the first oxide film is left on a second region of the semiconductor substrate. A second oxide film is formed on the first and second regions. A gate of a first transistor is formed on the first region with the second oxide film interposed. A gate of a second transistor is formed on the second region with the first and second oxide films interposed. Here, "using the first oxide film as a mask" includes using the first oxide film as a part of the mask.

As described above, the first oxide film formed before forming the element-isolating trench is used as a part of the gate insulating film of the second transistor, so that the amount of the oxidation applied to the trench isolation region can be reduced as compared with the case where the first oxide film is formed after forming the trench.

In another aspect of the present invention, a method of manufacturing a semiconductor device includes the following steps. A first oxide film is formed on a main surface of a semiconductor substrate. A trench is formed in an element-isolating region of the semiconductor substrate using the first oxide film as a mask. The first oxide film on a second region of the semiconductor substrate is removed while the first oxide film on a first region is left. An oxidation resistant film is formed on the first oxide film left on the first region. A second oxide film is formed on the second region with the first region covered with the oxidation resistant film. The first oxide film and the oxidation resistant film on the first region are removed. A third oxide film is formed on the first and second regions. A gate of a first transistor is formed on the first region with the third oxide film interposed. A gate of a second transistor is formed on the second region with the second and third oxide films interposed. Here, in the present specification, "an oxidation resistant film" refers to a film having an effect of preventing an oxidizing agent from diffusing into the underlying layer at the time of oxidation as compared with a general silicon oxide film.

In this aspect, the second oxide film is formed on the second region with the first region covered with the oxidation resistant film. Therefore, the trench isolation region in the first region can be prevented from being oxidized at the time of forming the second oxide film.

The oxidation resistant film described above is, for example, a film including at least one of a silicon nitride film and an oxynitride film.

The oxidation resistant film described above includes a silicon film. It is noted that "a silicon film" includes an amorphous silicon film, a polysilicon film, and a monocrystal silicon film.

In a further aspect of the present invention, a method of manufacturing a semiconductor device includes the following steps. A trench isolation region is formed in an element-isolating region on a main surface of a semiconductor substrate. A first oxide film is formed on the main surface of the semiconductor substrate by combusting $O_2$ gas and $H_2$ gas in the vicinity of the semiconductor substrate to produce an active oxidation species in the vicinity of the semiconductor substrate. The first oxide film on a first region of the semiconductor substrate is removed while the first oxide film is left on a second region. A second oxide film is formed on the first and second regions by combusting $O_2$ gas and $H_2$ gas in the vicinity of the semiconductor substrate to produce an active oxidation species in the vicinity of the semiconductor substrate. A gate of a first transistor is formed on the first region with the second oxide film interposed. A gate of a second transistor is formed on the second region with the first and second oxide films interposed.

As described above, both the first and second oxide films are formed by so-called lamp oxidation (lamp anneal), so that the amount of oxidation applied to the trench isolation region at the time of forming these oxide films can significantly be reduced as compared with the conventional example in which these oxide films are formed by common thermal oxidation.

The method of manufacturing a semiconductor device in accordance with the present invention is useful for a semiconductor device including a memory cell transistor region and a peripheral circuit region and having a gate insulating film of two or more different thicknesses, particularly for a non-volatile semiconductor memory device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A–1C are cross sectional views of a semiconductor device in accordance with a first embodiment of the present invention.

FIGS. 2A–2C to 11A–11C are cross sectional views showing first to tenth steps of manufacturing the semiconductor device shown in FIGS. 1A–1C.

FIGS. 12A–12C are cross sectional views of the semiconductor device in accordance with a second embodiment of the present invention.

FIGS. 13A–13C to 22A–22C are cross sectional views showing first to tenth steps characteristic of manufacturing the semiconductor device shown in FIGS. 12A–12C.

FIGS. 23A–23C to 27A–27C are cross sectional views showing first to fifth steps characteristic of manufacturing the semiconductor device in accordance with a third embodiment of the present invention.

FIGS. 28A–28C are cross sectional views of the semiconductor device in accordance with a fourth embodiment of the present invention.

FIGS. 29A–29C to 32A–32C are cross sectional views showing first to fourth steps characteristic of manufacturing the semiconductor device shown in FIGS. 28A–28C.

DESCRIPTION OF THE PREFERRED EMBODIMENTS

Embodiments of the Present Invention

In the following, with reference to FIGS. 1A–32C, the embodiments of the present invention will now be described. Although the present invention is applied to an AND type non-volatile semiconductor memory device in the following examples, the present invention may be applied to any semiconductor device as long as it has trench isolation and a gate insulating film of two or more different thicknesses.

A value such as a film thickness described in the embodiments is by way of illustration and is not be taken by way of limitation as long as it does not depart from the present invention.

Furthermore, a Vpp transistor is an example of a transistor having a thick gate insulating film in a peripheral circuit, and a Vcc transistor is an example of a transistor having a gate insulating film thinner than the Vpp transistor. In case of a non-volatile semiconductor memory device requiring that a high voltage be generated, a Vpp transistor for high voltage and a Vcc transistor for high performance are generally formed in the peripheral circuit. Alternatively, the peripheral circuit may be formed only with a Vpp transistor.

(First Embodiment)

FIGS. 1A–1C are partial cross sectional views of an AND type non-volatile semiconductor memory device in accordance with a first embodiment of the present invention, with a memory cell transistor region (FIG. 1A), a Vcc transistor (a transistor to which a relatively low voltage is applied) region of a peripheral circuit (FIG. 1B) and a Vpp transistor (a transistor to which a relatively high voltage is applied) region of the peripheral circuit (FIG. 1C). FIGS. 2A–11C are cross sectional views showing the first to tenth steps of manufacturing the AND type non-volatile semiconductor memory device shown in FIGS. 1A–1C. It is noted that an interlayer insulating film on each transistor and an interconnection on the upper layer are not shown.

As shown in FIGS. 1A–1C, a trench 7 for element-isolation is formed on a main surface of a silicon substrate (semiconductor substrate) 1, and a silicon oxide film (an insulating film) is buried in trench 7. As shown in FIG. 1A, in the memory cell transistor region, a memory cell transistor (an MOS transistor) 2 is formed on the main surface of silicon substrate 1, as shown in FIG. 1B, in the Vcc transistor region of the peripheral circuit, a Vcc transistor (an MOS transistor) 3 is formed on the main surface of silicon substrate 1, and as shown in FIG. 1C, in the Vpp transistor region of the peripheral circuit, a Vpp transistor (an MOS transistor) 4 is formed on the main surface of silicon substrate 1.

As shown in FIG. 1A, memory cell transistor 2 has an n-type impurity diffusion layer as a source/drain, a gate insulating film (a gate oxide film: a tunnel insulating film), a floating gate, an interlayer insulating film, and a control gate.

In the example shown in FIG. 1A, the n-type impurity diffusion layer has an LDD (Lightly Doped Drain) structure and includes an $n^+$impurity diffusion layer 5 and an $n^-$impurity diffusion layer 6. The gate insulating film is formed of a thermal oxide film (a silicon oxide film) 10 about 9 nm in thickness.

The floating gate includes a phosphorous-doped amorphous silicon film (a lower layer gate) 11 about 100 nm in thickness, and a phosphorous-doped amorphous silicon film (an upper layer gate) 13 about 50 nm in thickness.

A sidewall insulating film is formed on the sidewall of phosphorous-doped amorphous silicon film 11. A silicon oxide film 12 is buried between phosphorous-doped amorphous silicon films 11 of the adjacent memory cell transistors. Furthermore, phosphorous-doped amorphous silicon film 13 for the adjacent memory cell transistors is separated by a gap 14.

A so-called ONO film 15 in a non-volatile memory, which is a stacked film formed of an oxide film about 5 nm in thickness, a nitride film about 10 nm in thickness and an oxide film about 5 nm in thickness, is formed between the floating gate and the control gate. The control gate includes a phosphorous-doped amorphous silicon film 16 about 100 nm in thickness and a WSi film 17 about 100 nm in thickness. A silicon oxide film 18 is formed on this WSi film 17.

As shown in FIG. 1B, Vcc transistor 3 has an n-type impurity diffusion layer as a source/drain, a gate insulating film (a gate oxide film) and a gate. The n-type impurity diffusion layer has an LDD structure, and includes an $n^+$impurity diffusion layer and an $n^-$impurity diffusion layer. The gate insulating film is formed of a thermal oxide film 10 about 9 nm in thickness. The gate is formed of a stacked structure having phosphorous-doped amorphous silicon films 11, 13 and 16 and WSi film 17 as described above. It is noted that phosphorus-doped amorphous silicon films 13 and 16 are connected to each other through a contact hole locally provided in ONO film 15.

Vpp transistor 4 shown in FIG. 1C also has an n-type impurity diffusion layer as a source/drain, a gate insulating film (a gate oxide film) and a gate. In a manner similar to the Vcc transistor, the n-type impurity diffusion layer has an LDD structure and includes an $n^+$impurity diffusion layer and an $n^-$impurity diffusion layer. The gate is formed of a stacked structure having phosphorous-doped amorphous silicon films 11, 13 and 16 and WSi film 17.

The gate insulating film of Vpp transistor 4, however, is formed of a stacked structure having a thermal oxide film (a silicon oxide film) 9 and the aforementioned thermal oxide film 10, and has a thickness of about 30 nm, thicker than that of the gate insulating film of Vcc transistor 3.

The first embodiment is characterized in that thermal oxide film 9 to be a part of the gate insulating film in the MOS transistor having a relatively thick gate insulating film is formed before formation of a trench, thereby reducing the amount of oxidation applied to the trench in forming the gate insulating film. In addition, since thermal oxide film 10 is thinner than thermal oxide film 9, the amount of oxidation applied to the trench in forming the gate insulating film is further reduced.

A method of manufacturing the AND type non-volatile semiconductor memory device having the aforementioned structure will now be described with reference to FIGS. 2A–11C.

Thermal oxide film 9 approximately 27 nm in thickness is formed by thermally oxidizing the main surface of silicon (001) substrate 1. Silicon nitride film 19 is deposited by CVD or the like on this thermal oxide film 9. The thickness of silicon nitride film 19 is 180 nm.

A mask pattern is formed with a photoresist in a region to be active. Using this photoresist as a mask, silicon nitride film 19 and thermal oxide film 9 are successively patterned by a dry-etching process. Thereafter, the photoresist is removed.

Then, as shown in FIGS. 2A–2C in both the memory cell transistor and peripheral circuit regions, using the patterned silicon nitride film 19 and thermal oxide film 9 as a mask, an element-isolating region in silicon substrate 1 is etched 350 nm by a dry-etching process to form trench 7.

In order to restore the damage on the surface of trench 7 caused by the etching described above, the inner wall of trench 7 is oxidized by about 30 nm in an oxidation atmosphere at a high temperature. Thereafter, by using CVD or the like, silicon oxide film 8 is deposited on silicon substrate 1 to cover trench 7. Silicon oxide film 8 is thereby buried in trench 7. A CMP (Chemical Mechanical Polishing) process is performed on this silicon oxide film 8, as shown in FIGS. 3A–3C, to smooth out the surface of silicon oxide film 8 in both the memory cell transistor and peripheral circuit regions and to level the surface of the silicon oxide film 8 with the surface of silicon nitride film 19. Thereafter, silicon oxide film 8 is etched by 20 nm by HF solution.

Furthermore, silicon nitride film 19 is etched by hot phosphoric acid liquid to expose thermal oxide film 9 on the active region in both the memory cell transistor and peripheral circuit regions as shown in FIGS. 4A–4C. This forms element isolation (trench isolation).

Then, a mask to have a prescribed pattern is formed on silicon substrate 1 and impurity implantation is performed to form a p-well and an n-well. Another mask is further formed and channel doping is performed for controlling a threshold voltage for a p-channel MOS transistor and an n-channel MOS transistor in the peripheral circuit region. Here, since thermal oxide film 9 is still left, the impurity implantation is performed through thermal oxide film 9.

Then, as shown in FIGS. 5A–5C, a mask which has an opening in the memory cell transistor region and the Vcc transistor region of the peripheral circuit and covers the Vpp transistor region is formed using photoresist 20. Thereafter, thermal oxide film 9 in the memory cell transistor region and the Vcc transistor region of the peripheral circuit is removed by HF solution to expose the surface of silicon substrate 1 in those regions.

Then, as shown in FIGS. 6A–6C, photoresist 20 is removed. Therefore, 25 nm thermal oxide film 9 is left on the Vpp transistor region of the peripheral circuit.

Thermal oxidation is performed in such a state as shown in FIGS. 6A–6C to form thermal oxide film 10 of 9 nm, as shown in FIGS. 7A–7C. This thermal oxide film 10 will be a tunnel oxide film of memory cell transistor 2 in the memory cell transistor region, and will be a gate oxide film of Vcc transistor 4 in the Vcc transistor region of the peripheral circuit.

At this point, in the Vpp transistor region, already existing thermal oxide film 9 undergoes thermal oxidation, so that thermal oxide film 10 is formed on thermal oxide film 9 as shown in FIG. 7C. As a result, a thick gate oxide film of about 30 nm is formed in the Vpp transistor region. It is noted that in an actual device, thermal oxide film 9 and thermal oxide film 10 integrally exist to form one film.

Conventionally, a gate insulating film of each transistor is normally formed by performing thermal oxidation twice after trench formation. Therefore, the trench isolation region of the memory cell transistor region is also subjected to thermal oxidation twice.

On the contrary, in the present invention described above, the oxide film underlaid at the time of forming the trench isolation is used in a part of the gate insulating film of Vpp transistor 4, so that only thermal oxidation for forming thermal oxide film 10 of 9 nm is performed on the trench isolation region in the memory cell transistor region. Therefore, the amount of oxidation applied to the memory cell transistor region having a narrower isolation pitch and being susceptible to stress can be reduced more significantly than a conventional example.

In the flow of the present embodiment, the oxide film underlaid at the time of implantation for forming the well or the channel is used as a part of the gate insulating film of Vpp transistor 4, and therefore it is assumed that the control and reliability of the thickness of the gate insulating film will be slightly poorer than a conventional example. It, however, does not matter because Vpp transistor 4 is not designed to be performance-oriented and needs only have such a gate insulating film that is thick enough to lower an electric field applied to the gate insulating film for assuring reliability of that insulating film.

It is noted that although in the present embodiment the thickness of the tunnel insulating film of memory cell transistor 2 is equal to the thickness of the gate insulating film of Vcc transistor 3, they may have different thicknesses. In addition, the semiconductor device may be formed only with memory cell transistor 2 and Vpp transistor 4 without fabricating Vcc transistor 3.

As described above, in the present invention, the tunnel insulating film of memory cell transistor 2 required of high reliability is formed after forming the trench and a part of the gate insulating film of the transistor in the peripheral circuit having the gate oxide film thicker than the tunnel insulating film is formed before forming the trench, thereby reducing the oxidation stress applied to the trench isolation.

Alternatively, thermal oxide film 10 to be a tunnel insulating film may be formed by the following lamp oxidation rather than by common oxidation. More specifically, thermal oxide film 10 may be formed while $O_2$ gas and $H_2$ gas are introduced into a chamber under a reduced pressure and combusted in the vicinity of the wafer to produce an active oxide species in the vicinity of the wafer. By adapting such lamp oxidation, the oxidation stress applied to the trench isolation can be prevented more effectively.

The active oxidation species in the aforementioned lamp oxidation vigorously reacts with silicon substrate 1 on the exposed silicon substrate 1 to grow an oxide film. On the contrary, the active oxidation species (oxygen radical) becomes inactive within the trench isolation as it diffuses in silicon oxide film 8. Therefore, as compared with normal thermal oxidation, the amount of oxidation in the trench isolation can significantly be reduced, so that the oxidation stress applied to the trench isolation can be prevented as described above.

Thereafter, approximately 100 nm phosphorus-doped amorphous silicon film 11 and approximately 180 nm silicon nitride film 21 are respectively deposited using CVD or the like. A photoresist is applied onto silicon nitride film 21, and the photoresist is patterned only on the memory cell transistor region. At this point, the Vcc transistor region and the Vpp transistor region are covered with the photoresist.

Using the photoresist described above as a mask, dry anisotropic etching is performed on silicon nitride film 21 to pattern silicon nitride film 21. Uing this patterned silicon nitride film 21 as a mask, anisotropic etching is performed to pattern phosphorus-doped amorphous silicon film 11 as shown in FIG. 8A.

It is noted that a phosphorus-doped polysilicon film, a non-doped silicon film, or a conductive film doped with other impurity can be used in place of the phosphorus-doped amorphous silicon film, in the present invention.

Then, As is implanted at 30 keV by approximately $5 \times 10^{13}/cm^2$ for forming n⁻impurity diffusion layer 6 of the memory cell transistor. After a TEOS (Tetra Ethyl Ortho Silicate) oxide film is deposited, anisotropic etching is performed to form a sidewall insulating film on the sidewall of phosphorus-doped amorphous silicon film 11. Using this sidewall insulating film as a mask, As is implanted at 30 keV by approximately $1 \times 10^{15}/cm^2$. This forms an LDD structure.

Silicon oxide film 12 is then deposited 400 nm by CVD, and silicon oxide film 12 is planarized by CMP. Thereafter, silicon oxide film 12 left on silicon nitride film 21 is removed by dry etchback, and then silicon nitride film 21 is removed by hot phosphoric acid. Therefore, the upper surface of phosphorus-doped amorphous silicon film 11 on the memory cell transistor and peripheral circuit regions is exposed. Thereafter, as shown in FIGS. 9A–9C, phosphorus-doped amorphous silicon film 13 is deposited 50 nm by CVD.

A photoresist is then applied onto phosphorus-doped amorphous silicon film 13, and the photoresist is patterned to have an opening only on the memory cell transistor region. Using this photoresist as a mask, anisotropic etching is performed to form gap 14, as shown in FIG. 10A. Therefore, phosphorus-doped amorphous silicon film 13 to be an upper layer floating gate of the memory cell can be separated between the adjacent memory cells.

Thereafter, an oxide film, a nitride film and an oxide film are successively formed by CVD to form ONO film 15 which covers phosphorus-doped amorphous silicon film 13. Then, photoresist 22 is applied to cover ONO film 15, and an opening portion is provided in that part of photoresist 22 which is positioned on the gate of the peripheral circuit. Using this photoresist 22 as a mask, ONO film 15 is etched to form a contact hole 29, as, shown in FIGS. 10B and 10C.

After removal of photoresist 22, phosphorus-doped amorphous silicon film 16, WSi film 17 and silicon oxide film 18 are successively deposited by CVD as shown in FIGS. 11A–11C.

Therefore, ONO film 15 insulates the first gate (floating gate: phosphorus-doped amorphous silicon films 11 and 13) from the second gate (control gate: phosphorus-doped amorphous silicon film 16 and WSi film 17) of the memory cell transistor, while the first gate is electrically connected with the second gate through contact hole 29 in a portion to be the gate of MOS transistor of the peripheral circuit. In other words, the gate is formed with a stacked structure of the first and second gates in Vcc and Vpp transistors 3 and 4 of the peripheral circuit.

After a word line pattern in the memory cell transistor region and a gate pattern in the peripheral circuit are formed using a photoresist, silicon oxide film 18 is dry-etched using the photoresist as a mask. After removing the photoresist above, WSi film 17, phosphorus-doped amorphous silicon film 16, ONO film 15 and phosphorus-doped amorphous silicon films 13 and 11 are successively etched using the patterned silicon oxide film 18 as a mask. Therefore, a memory cell transistor and a gate of a transistor in the peripheral circuit are formed.

Thereafter, the source and drain of the transistor in the peripheral circuit is formed to have an LDD structure by using a well known technique, and after depositing an interlayer insulating film (not shown), an interconnection (not shown) is formed. This results in the AND type non-volatile semiconductor memory device having the structure shown in FIGS. 1A–1C.

(Second Embodiment)

A second embodiment of the present invention will now be described with reference to FIGS. 12A–22C. FIGS. 12A–12C are partial cross sectional views of the AND type non-volatile semiconductor memory device in accordance with the second embodiment of the present invention, with the memory cell transistor region (FIG. 12A), the Vcc transistor region of the peripheral circuit (FIG. 12B) and the Vpp transistor region of the peripheral circuit (FIG. 12C). FIGS. 13A–22C are cross sectional views showing the first to tenth steps characteristic of manufacturing the AND type non-volatile semiconductor memory device shown in FIGS. 12A–12C. It is noted that an interlayer insulating film on each transistor and an upper layer interconnection are not shown.

As shown in FIGS. 12A–12C, in the second embodiment, a thermal oxide film 25 is formed in place of thermal oxide film 9 in FIG. 1C. This thermal oxide film 25 is formed by thermally oxidizing the main surface of silicon substrate 1 with the memory cell transistor and Vcc transistor regions covered with an oxidation resistant mask (a silicon nitride film) as described later after forming the trench isolation. By adapting such an oxide film, the amount of oxidation applied to the trench isolation region in the memory cell transistor region or the Vcc transistor region at the time of forming thermal oxide film 25 can be reduced, so that stress applied to the trench isolation region in these regions can be relieved as compared with a conventional example.

It is noted that the stress can be further relieved by forming thermal oxide film 25 by the aforementioned lamp oxidation. The structure is similar to the first embodiment except for the above noted point, and therefore the description thereof will not be repeated.

A method of manufacturing the AND type non-volatile semiconductor memory device in accordance with the present embodiment will be described.

Trench 7, silicon oxide film 8, a p-well and an n-well, a channel doped region and thermal oxide film 9 are formed on the main surface of silicon substrate 1 using a technique similar to the first embodiment.

Thereafter, as shown in FIGS. 13A–13C, silicon nitride film 23 having oxidation resistance is deposited about 10 nm by CVD to cover thermal oxide film 9. Generally, a film having oxidation resistance includes a silicon nitride film, but an oxynitride film or the like may be used as long as it has an oxidation resistance. Here, an oxidation resistant film refers to a film having an effect of preventing an oxidizing agent from diffusing into the isolation under the film in the subsequent gate oxidation as compared with a general silicon oxide film.

A photoresist 24 is then applied onto silicon nitride film 23, and photoresist 24 is patterned. Then, as shown in FIGS. 14A–14C, a mask which has an opening on the Vpp transistor region and covers the memory cell transistor region and the Vcc transistor region is formed with photoresist 24.

Using photoresist 24 as a mask, silicon nitride film 23 on the Vpp transistor region is dry-etched to expose thermal oxide film 9 on the Vpp transistor region. In this dry-etching process, the etching is terminated at thermal oxide film 9 so that silicon substrate 1 cannot be etched.

The aforementioned photoresist 24 is removed, and using the patterned silicon nitride film 23 as a mask thermal oxide film 9 on the Vpp transistor region is removed by HF solution. Therefore, as shown in FIGS. 15A–15C, silicon substrate 1 on the Vpp transistor region is exposed. It is noted that thermal oxide film 9 may be removed by HF solution before removal of photoresist 24.

Then, as shown in FIGS. 16A–16C, thermal oxide film 25 having a thickness of about 25 nm is formed in the Vpp transistor region for example by thermal oxidation or the like. At this point, the memory cell transistor region and the Vcc transistor region are hardly oxidized since they are covered with silicon nitride film 23.

In a conventional, general process, the surface of silicon substrate 1 is exposed in the memory cell transistor region and the Vcc transistor region at the time of forming thermal oxide film 25, and therefore such regions are also oxidized. Accordingly, the trench isolation region is also oxidized in these regions.

On the contrary, in the process of the second embodiment, the memory cell transistor region and the Vcc transistor region are hardly oxidized at the time of forming thermal oxide film 25, and therefore the amount of oxidation of the trench isolation region in these regions can be reduced as compared with a conventional example.

It is noted that the amount of oxidation in the trench isolation region can be reduced more effectively by forming thermal oxide film 25 by the lamp oxidation described in the first embodiment, so that the stress can be reduced in the trench isolation region effectively.

A mask which has an opening on the memory cell transistor region and the Vcc transistor region and covers the Vpp transistor region is then formed with a photoresist 26. Using this photoresist 26 as a mask, silicon nitride film 23 on the memory cell transistor and Vcc transistor regions is dry-etched. In this dry-etching process, the etching is terminated at thermal oxide film 9 so that silicon substrate 1 may not be etched.

Then, with photoresist 26 being left, thermal oxide film 9 on the memory cell transistor and Vcc transistor regions is removed by HF solution to expose the surface of silicon substrate 1 on these regions, as shown in FIGS. 17A–17C. Thereafter, photoresist 26 is removed.

Thermal oxide film 10 having a thickness of about 9 nm is then formed as shown in FIGS. 18A–18C. This thermal oxide film 10 will be a tunnel insulating film in the memory cell transistor region and will be a gate insulating film in the Vcc transistor region. In the Vpp transistor region, the thermal oxidation of about 9 nm as described above is added to thermal oxide film 25, resulting in formation of a thick gate insulating film of about 30 nm. Note that it is effective in reducing the stress in the trench isolation region if thermal oxide film 10 is also formed by the aforementioned lamp oxidation.

Thereafter, through the steps similar to the first embodiment, phosphorus-doped amorphous silicon film 11, silicon oxide film 12, phosphorus-doped amorphous silicon film 13, ONO film 15, phosphorus-doped amorphous silicon film 16, WSi film 17, silicon oxide film 18, and the like are formed and patterned into a prescribed shape, as shown in FIGS. 19A–19C and 22A–22C. Therefore, memory cell transistor 2 and the gates of transistors 3 and 4 in the peripheral circuit are formed.

Thereafter, using a well known technique, the source and drain of transistors 3, 4 in the peripheral circuit is formed to have an LDD structure, and after deposition of an interlayer insulating film (not shown), an interconnection (not shown) is formed. This results in the AND type non-volatile semiconductor memory device having the structure shown in FIGS. 12A–12C.

(Third Embodiment)

A third embodiment of the present invention will now be described with reference to FIGS. 23A–27C. FIGS. 23A–27C are cross sectional views showing the first to fifth steps characteristic of manufacturing the AND type non-volatile semiconductor memory device in accordance with the third embodiment. It is noted that the structure of the AND type non-volatile semiconductor memory device in the present embodiment is similar to that of the second embodiment, and therefore illustration and description of the structure will not be repeated.

First, the steps similar to the first embodiment are carried out until thermal oxide film 9 is formed. Thereafter, as shown in FIGS. 23A–23C, an amorphous silicon film 31 is formed by about 10 nm by CVD. The thickness of this amorphous silicon film 31 is made not more than one half of the thickness of thermal oxide film 25 to be formed in the Vpp transistor region in the subsequent step.

Generally, when silicon is thermally oxidized, a thermal oxide film having about twice the thickness of the silicon is formed. Therefore, by forming amorphous silicon film 31 to have the aforementioned thickness, amorphous silicon film 31 can entirely be changed to a silicon oxide film at the time of forming thermal oxide film 25. It is noted that other silicon film such as a polysilicon film or the like may be used in place of amorphous silicon film 31.

On amorphous silicon film 31, as shown in FIGS. 24A–24C, a mask which covers the memory cell transistor region and the Vcc transistor region and has an opening on the Vpp transistor region is formed with a photoresist 32. Using this photoresist 32 as a mask, amorphous silicon film 31 on the Vpp transistor region is dry-etched. In this dry-etching process, the etching is terminated at thermal oxide film (the oxide film formed before formation of the trench) 9, so that silicon substrate 1 cannot be etched. Thereafter, photoresist 32 is to remove.

Thermal oxide film 9 on the Vpp transistor region is then etched away by HF solution using the patterned amorphous silicon film 31 as a mask, as shown in FIGS. 25A–25C. It is noted that thermal oxide film 9 may be removed by HF solution before removal of photoresist 32.

Thermal oxide film 25 having a thickness of 25 nm is formed on the Vpp transistor region for example by thermal oxidation or the like as shown in FIG. 26C. At this point, amorphous silicon film 31 covering the memory cell transistor region and the Vcc transistor region is also oxidized to form silicon oxide film 33 entirely as shown in FIGS. 26A and 26B.

Furthermore, amorphous silicon film 31 takes in an oxidation species in the process of becoming a silicon oxide film, so that the oxidation species can be prevented from diffusing into the trench isolation (which is underlying). Therefore, amorphous silicon film 31 can be said to serve as an oxidation resistant film in the present invention.

Because of the aforementioned amorphous silicon film 31, the oxidation stress in the trench isolation in the memory cell transistor and Vcc transistor regions can be reduced as with the second embodiment. It is noted that it is more effective in relieving the oxidation stress if thermal oxide film 25 is formed by the aforementioned lamp oxidation.

A mask which has an opening on the memory cell transistor region and the Vcc transistor region and covers the Vpp transistor region is then formed with a photoresist 34. Wet-etching is performed by HF solution using this photoresist 34 as a mask, to remove the stacked film with thermal oxide film 9 and silicon oxide film 33 formed by oxidizing amorphous silicon film 31 on the memory cell transistor and Vcc transistor regions. Thereafter, photoresist 34 is removed.

An important difference between the present third embodiment and the second embodiment is in that the oxidation resistant film changes to the same oxide film with the underlying oxide film. Therefore, the oxide film formed by the changed oxidation resistant film and the underlying oxide film can be etched away at one time.

In the second embodiment, it is necessary to perform dry-etching so as not to penetrate the underlying thermal oxide film 9 and therefore it is difficult to control the etching. In addition, since an insulating film with high reliability is required for a tunnel insulating film of a non-volatile semiconductor memory device, it is preferable that the area in which a tunnel insulating film is formed is not irradiated with plasma in a dry-etching process.

Here, the underlying oxide film, and silicon oxide film 33 formed by oxidizing amorphous silicon film 31 are removed at one time by wet-etching as described above, so that the problem of difficulty in controlling etching and of plasma irradiation can be avoided. Furthermore, the number of etching processes can be reduced.

Thereafter, the steps similar to the second embodiment will follow, resulting in the AND type non-volatile semiconductor memory device having the structure shown in FIGS. 12A–12C.

(Fourth Embodiment)

A fourth embodiment of the present invention will now be described with reference to FIGS. 28A–32C. FIGS. 28A–28C are partial cross sectional views of the AND type non-volatile semiconductor memory device in accordance with the fourth embodiment of the present invention, with the memory cell transistor region (FIG. 28A), the Vcc transistor region in the peripheral circuit (FIG. 28B) and the Vpp transistor region in the peripheral circuit (FIG. 28C). FIGS. 29A–32C are cross sectional views showing the first to fourth steps characteristic of manufacturing the AND type non-volatile semiconductor memory device shown in FIGS. 28A–28C. It is noted that an interlayer insulating film on each transistor and an upper layer interconnection are not shown.

As shown in FIGS. 28A–28C, in the present fourth embodiment, thermal oxide film 35 is formed in place of thermal oxide film 9 in FIG. 1C, and thermal oxide film 36 is formed in place of thermal oxide film 10 in FIGS. 1A–1C.

These thermal oxide films 35 and 36 are formed by the aforementioned lamp oxidation after forming the trench isolation. By adapting such oxide films, the amount of oxidation applied to the trench isolation region can be reduced and thus the stress applied to the trench isolation region can be relieved as compared with a conventional example. The structure except for this point is similar to the first embodiment and therefore the description thereof will not be repeated.

A method of manufacturing the AND type non-volatile semiconductor memory device shown in FIGS. 28A–28C will now be described.

The surface of thermal oxide film 9 is exposed through the steps similar to the first embodiment. Thereafter, as shown in FIGS. 29A–29C, thermal oxide film 9 is etched away by HF solution or the like.

The aforementioned lamp oxidation is then performed to form thermal oxide film 35 of 25 nm. A mask which has an opening in the memory cell transistor and Vcc transistor regions and covers the Vpp transistor region is formed with photoresist 37 on this thermal oxide film 35. Using this photoresist 37 as a mask, wet-etching using HF solution is performed to remove thermal oxide film 35 on the memory cell transistor and Vcc transistor regions to expose the surface of silicon substrate 1 in these regions, as shown in FIGS. 30A–30C.

After photoresist 37 is removed, lamp oxidation is again performed to form thermal oxide film 36 of 9 nm as shown in FIGS. 31A–31C. This thermal oxide film 36 will be a tunnel insulating film of memory cell transistor 2 and will be a gate insulating film of Vcc transistor 3. On the other hand, since thermal oxide film 35 is formed in the Vpp transistor region, the oxidation of 9 nm described above is added to thermal oxide film 35, resulting in formation of a thick gate insulating film of about 30 nm.

Thereafter, in a manner similar to the first embodiment, phosphorus-doped amorphous silicon film 11 and silicon nitride film 21 are deposited to have respective thicknesses of 100 nm and 180 nm by CVD, and are patterned into a prescribed shape, as shown in FIGS. 32A–32C.

Thereafter, the steps similar to the first embodiment will follow, resulting in formation of the AND type non-volatile semiconductor memory device shown in FIGS. 28A–28C.

As described above, in accordance with the present invention, it is possible to reduce the amount of oxidation applied to a trench isolation region at the time of forming a gate insulating film of a transistor. Therefore, it is possible to avoid excessive oxidation in the trench isolation region and also to prevent a defect resulting from the excessive oxidation. As a result, a semiconductor device with high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a first oxide film on a main surface of a semiconductor substrate;

forming a trench in an element-isolating region of said semiconductor substrate using said first oxide film as a mask;

leaving said first oxide film on a first region while removing said first oxide film on a second region of said semiconductor substrate;

forming an oxidation resistant film on said first oxide film left on said first region;

forming a second oxide film on said second region with said first region covered with said oxidation resistant film;

removing said first oxide film and said oxidation resistant film;

forming a third oxide film on said first and second regions;

forming a gate of a first transistor on said first region with said third oxide film interposed; and forming a gate of a second transistor on said second region with said second and third oxide films interposed.

2. The method of manufacturing a semiconductor device according to claim 1, wherein
   said oxidation resistant film includes at least one of a silicon nitride film and an oxynitride film.

3. The method of manufacturing a semiconductor device according to claim 1, wherein
   said oxidation resistant film includes a silicon film,
   said oxidation resistant film changes to a silicon oxide film at the time of forming said second oxide film, and
   the step of removing said oxidation resistant film includes the step of removing said oxidation resistant film which has changed to a silicon oxide film.

4. The method of manufacturing a semiconductor device according to claim 3, wherein
   the thickness of said silicon film is at most half the thickness of said second oxide film.

5. The method of manufacturing a semiconductor device according to claim 1, wherein
   at least one of said second and third oxide films is formed by combusting $O_2$ gas and $H_2$ gas in the vicinity of said semiconductor substrate to produce an active oxidation species in the vicinity of said semiconductor substrate.

* * * * *